United States Patent [19]

Yamamoto et al.

[11] Patent Number: 5,631,673
[45] Date of Patent: May 20, 1997

[54] CONTROL DEVICE

[75] Inventors: Hiroyuki Yamamoto; Takeshi Wakabayashi, both of Kyoto; Yoshihisa Nakagawa, Joyo, all of Japan

[73] Assignee: Omron Corporation, Japan

[21] Appl. No.: 169,137

[22] Filed: Dec. 20, 1993

[30] Foreign Application Priority Data

| Dec. 25, 1992 | [JP] | Japan | 4-357843 |
| Feb. 4, 1993 | [JP] | Japan | 5-042071 |
| Oct. 18, 1993 | [JP] | Japan | 5-284501 |

[51] Int. Cl.$^6$ .................................................. G09G 5/00
[52] U.S. Cl. ............................................ 345/905; 345/168
[58] Field of Search ................................ 341/22; 345/56, 345/124, 156, 123, 168, 172, 905

[56] References Cited

U.S. PATENT DOCUMENTS

| 4,295,180 | 10/1981 | Herron et al. | 361/383 |
| 4,488,148 | 12/1984 | Kuciera | 345/172 |
| 4,896,370 | 1/1990 | Kasparian | 455/77 |
| 4,902,878 | 2/1990 | Smith | 345/168 |
| 4,977,396 | 12/1990 | Inoue | 345/156 |
| 5,160,832 | 11/1992 | Hubert et al. | 235/145 R |
| 5,237,327 | 8/1993 | Saitoh | 341/22 |
| 5,398,597 | 3/1995 | Jones | 99/330 |

FOREIGN PATENT DOCUMENTS

| 0491270 | 6/1992 | European Pat. Off. . | |
| 285880 | 3/1990 | Japan | 345/905 |
| 2304589 | 12/1990 | Japan | 345/905 |
| 4196727 | 7/1992 | Japan | 345/905 |

*Primary Examiner*—Mark R. Powell
*Assistant Examiner*—Matthew Luu
*Attorney, Agent, or Firm*—Klima & Hopkins, P.C.

[57] ABSTRACT

A control device with improved connection between display device and printed circuit board assembly, and improved key switches having beveled keytops. Further, the control device is configured to display the mode of internal manual switches without directly accessing the internal manual switches.

9 Claims, 14 Drawing Sheets

CONTROL DEVICE

FIELD OF THE INVENTION

This invention relates to a control device for controlling industrial electronic equipment. The control device can include, for example, a counter for counting the number of operating cycles or timer for measuring operating times, and is used to perform various control functions. More specifically, the present invention relates to a control device with improved connection between the front display assembly and printed circuit board assembly in the main cabinet, improved input keys associated with the display, and means for displaying the internal manual switch mode on the display.

BACKGROUND OF THE INVENTION

Existing control devices, counters for example, as shown in FIGS. 19 and 20 consist of a front display assembly 40, a base 57, a front panel 42, upper and lower panels 43 and 44, and left and right panels 45 and 46.

The front display assembly 40 has a front casing 47, which includes a square case 48. On the front of square case 48 is a numeric display 49, and below this display 49 are two (2) horizontal rows of keyholes 50 and 51. The back of square case 48 is molded to accept installation of switch mechanisms.

Extending from the four corners at the back of the square case 48 are four hooks 52 that cooperate with the printed circuit board assembly. The hooks 52 are rectangular in shape, and each has a horizontal slot 52a provided in a center portion thereof. In the center of its upper and lateral surfaces, the case 48 has hooks 53, each of which is provided with a slot 53c. A front panel 42 of the printed circuit board assembly is provided at its top and sides with tabs 54, which engage with the slots 53c of hooks 53.

A liquid crystal display ("LCD") 55 is inserted into the front casing 47, and rubber connectors 56 are inserted into grooves (not pictured) in front casing 47 and LCD 55. A backlight 55a is pushed in the front casing 47, and front panel 42 is inserted and locked into front casing 47 when the tabs 54 on the top and sides of the front panel 42 engage in the slots 53c of the hook of the top and sides of the case 48. The front panel 42 is then soldered to backlight 55a and LCD 55.

A base 57 is attached to printed boards 43, 44, 45 and 46 to form the printed circuit board assembly, and the circuit board assembly is then fitted into the front assembly 40. Tabs 43a and 44a on upper and lower boards 43 and 44 fit into slots 52a on hooks 52. Subsequently, the front panel 42 is soldered via solder bridges to a remaining portion of the printed circuit board assembly in the particular method of assembly.

In the existing control device described above, the hooks 53 had a considerable width. Thus, a large portion of the sides were dedicated to their use blocking access to the printed circuit board assembly from the sides of the device after full assembly. This makes it difficult to secure sufficient space for any number of solder bridges 63, as shown in FIG. 21, or impossible to install, for example dipswitches or other electronic components on the front panel 42, due to the need for access to these components after the final assembly for changing operating mode.

Alternatively, the hooks 53 as shown in FIGS. 22 and 23 are sometimes used in order to efficiently use the sides of the front panel 42 and provide easy access from the sides thereto. However, to mold the projections 53b on hooks 53, holes 62 must be provided in numeric display 49 on the front of case 48, as shown in FIG. 23. In addition to being unsightly, these holes make it difficult to insure that the front panel is watertight.

Further, in the existing device the keys on the front display are configured in two (2) narrow rows making it difficult to selectively actuate a key in one row without also inadvertently actuating a corresponding key in the other row with the finger tip of the person making key selections. In addition, the existing keys are defined by rectangular parallelograms having a flat upper surface again increasing the chance of inadvertent selection of keys. The present invention overcomes this particular problem by changing the configuration of the upper surface to be beveled to be explained in detail below.

Further, the existing control devices are difficult to adjust the mode of operation.

As shown in FIG. 24, the face 101a of case 101 has a key panel 102 with keys for setting numerical values, and a display 4 and 5 for displaying present values and set values, respectively, consisting of seven-segment LEDs.

Inside the case 101 is a built-in mode switch (not shown), which is covered by cover C. This mode switch may consist of, for example, dipswitches connected to a control circuit for input and output such as a one-chip microprocessor. The mode switch is used to switch among the various modes including input mode, output mode, maximum counting speed, one-shot output time, and so on.

With this type of control device, the user cannot adjust the timing at which signals are received from or sent to other devices, nor can he set or change the value for the one-shot output time, which controls the operating time of the output actuator. Rather, the various initial values of the control device are set at the factory. This being the case, it is often necessary to set or change the auxiliary values. The existing devices have several schemes by which the user can change these settings. A first scheme is to provide a continuously variable control mounted on the device, a second scheme is to have dipswitches on the device, and a third scheme is to provide a mode key on the front of the case to switch among the setting modes for auxiliary values so that each value can be entered in its own mode.

In existing control devices of the type described above, the user must confirm that the dipswitches or other switching devices have indeed been switched to the correct mode by removing a cover C, as shown in FIG. 24, and viewing the position of the switches through the opening in case 101. Generally, control devices A such as counters have their display assembly 101a and value setting device 102 on front panel 101a. Only the front panel 101a is exposed in the control panel B while the rest of the control device is located behind the control panel B making it difficult to access and exposed on the front surface of the case. Thus, whenever the user desires to check the position of the dipswitches or settings on other electronic components (i.e. mode), the user must remove the control device from the control panel and then open the cover C of the control device to view the setting on the electronic component.

If the aforesaid control device A is permanently mounted to control panel B, or if the aforesaid cover C of the control device is locked in place by means of mounting clip D, it is not possible to check the settings until after removing the control device A from control panel B. Thus, checking the settings by disassembling the control device is a laborious and time-consuming operation.

In other existing devices, when a variable control is used to set and change auxiliary values such as the aforesaid one-shot output time, it is easy to fine-tune the settings. However, the accuracy of the values is poor, and are liable to change due to the influence of external factors such as temperature. When dipswitches are used, the user must select one from at most two to ten predetermined values, so more precise settings for the auxiliary values are not possible. When using a mode key on the front of the case, which tends to be used infrequently, it raises the possibility of the switch being operated accidentally, or of the values being changed as a joke or prank. This could cause an entire system to malfunction.

SUMMARY OF THE INVENTION

The present invention was developed in view of the problems discussed above.

A primary object of the present invention is to provide an improved control device having a wider space on the sides of the front panel of the printed circuit board assembly to allow a number of soldering bridges to be made during assembly of the control device, allowing dipswitches to be installed in this space, and eliminate the problem of holes resulting from molding in some of the existing numeric displays.

Another object of the present invention is to provide an improved control device with a display assembly that can be mounted securely to the printed circuit board assembly merely by pushing the display assembly onto the printed circuit board assembly.

A further object of the present invention is to provide an improved control device with a display panel designed so that the displayed values are not hidden by the operator's finger when operating the selection keys. Further, the keys are configured to prevent a user from accidentally striking another key in an opposite row when operating the up and down-counting keys in either the upper or lower row. When the operator's finger moves lightly from one row to the other, the keys should have almost the feel of seesawing from one key to the other.

Another principal object of the present invention is to provide a control device so that the mode of manual internal switches can be checked regardless of whether the device is mounted on a control panel, such that the checking operation requires little labor and is easy to perform.

A further object of the present invention is to prevent values from being set or changed accidentally or as a matter of a joke or prank while providing an arrangement that does not make it harder for the user to operate the device; and to make it possible to set or change auxiliary values such as the one-shot output time more easily and accurately.

The control device according to the present invention is designed so that it has at least one hook which engages with a projection on the printed circuit board assembly. The main portion of the printed circuit board assembly is initially separate from the front panel of the circuit board assembly.

In one embodiment, a pair of hooks are each placed at corners of the front casing of the display assembly. Projecting rearwardly from the two corners of the front casing are catches with slots cut in them into which projecting portions of the front panel engage. In one embodiment, the hook is provided with two catches, one having the above slot type configuration and the other having an oblique member extending forward and gripping a rear portion of the front panel when secured.

The top and bottom panels of the printed circuit board assembly are provided with tabs defined by cut out portions of the edges thereof. Further, the front panel is provided with one or more tabs. The tabs of the top and bottom panels engage with the hooks of the display assembly when the tips of the hooks of the front assembly are pushed onto the tabs of the top and bottom panels. When fully engaged, the tabs on the top and bottom panels are received within the slots of the hooks so that catches of the hook retain the tabs of the top and bottom panels. Further, a tab on the top edge of the front panel engages with a hook on the top of the display assembly.

In a preferred embodiment, four hooks are provided at the corners of the display assembly. The two lower hooks are each provided with a first catch having a slot type configuration and a second catch having an oblique member extending forward and engaging the rear of the front panel when fully engaged. The front panel having cut portions at the corners thereof provide center side tabs that act as guides for the second catch during assembly and are engaged by the second catch. Specially, the center side tabs bias each second catch outwardly during assembly to allow the catch to snap fit behind the center side tabs of the front panel.

The control device according to the present invention can be provided with two horizontal rows of up and down-counting key switches located just below the display panel of the front casing. The tops of the keys in both rows are beveled so that the keytops in each row incline toward those in the other row. The keys in the upper row protrude further than those in the lower row.

In the control devices according to the present invention, when the display assembly is connected to the printed circuit board assembly, large spaces are available on the sides of the front panel of the printed circuit board assembly. These spaces can be used for a number of solder bridges, or dipswitches can be mounted in them.

With respect to the existing molding process, the control devices according to the present invention obviate the necessity for holes in the numeric display, which are unsightly and make it difficult to insure that the front panel is watertight.

The configuration of the control devices according to the present invention allows the display assembly to be mounted securely to the printed circuit board assembly merely by pushing it until the ends of the hooks slip into the openings in the panel.

The configuration of the control devices according to the present invention can include two rows of up and down-counting keys provided just below the numeric display to insure that the values are not hidden by the operator's finger when he is operating the key switches.

Further, because the tops of the keys in each row are beveled, the user is prevented from accidentally striking a key in the opposite row when the user is operating the up and downcounting keys in either row, despite the limited space available for the keys. The upper and lower rows are adjacent to each other so that when the user's finger moves easily from one row to the other, the keys have seesaw type action.

The present invention is also directed to a display device having a configuration to display the mode of internal manual switches.

The control devices according to the present invention include a display having a predetermined switch, and a mode-switching assembly consisting of a number of dipswitches built into the interior of the device. When the predetermined switch is held down while the power supply is being connected, the ON or OFF state of each dipswitch is shown on the display as long as the switch remains depressed.

The control device has on the front thereof a main value numeric display capable of displaying figures of several places, and a main input switch assembly consisting of a number of operating keys equal to the number of places in the main value display. This device is distinguished by the fact that when a specific predetermined key, which is one of the operating keys of the main input switch assembly, is held down while the power supply is being connected, the switch assembly shifts to its auxiliary setting mode and the current auxiliary values are displayed on the main numeric display, and it becomes possible to change the auxiliary values by operating the keys in the auxiliary mode.

The auxiliary values of a one-shot output time for the device can be displayed. Further, the device is configured so that the output time which has been set will be stored in the system memory if the power is cut off.

The operator can operate the device to see what mode the dipswitches are set to by viewing the values displayed on the front of the case regardless of whether the control device is mounted on the control panel, and it is extremely simple to check these values.

When a predetermined key, which is one of the several operating keys constituting the main input switch assembly, is held down while the power supply is being connected, the switch assembly shifts to its auxiliary setting mode, and the current auxiliary values are displayed on the main numeric display. Thus, there is no need for an additional set of switches to set or change the auxiliary values. The values are easily set or changed, and there is no mode key, so the user cannot accidentally change the values, nor can they be changed as a joke or prank. Since one set of operating keys on the front of the case is used to set both the main and the auxiliary values, the size of the keytops can be increased to make it easier for the user to operate the switches. Using the operating keys to change the auxiliary values allows greater accuracy and precision than do dipswitches or a continuously variable switch.

BRIEF DESCRIPTION OF THE DRAWING

FIG. 8 (2) illustrates how dipswitches can be installed on the right panel.

DETAILED DESCRIPTION OF THE INVENTION

The following is a detailed description of a preferred embodiment of the control device according to the present invention with reference to the drawings. This particular control device is a counter, however, the present invention is directed to control devices in general and is not limited to a counter.

Figure 1:
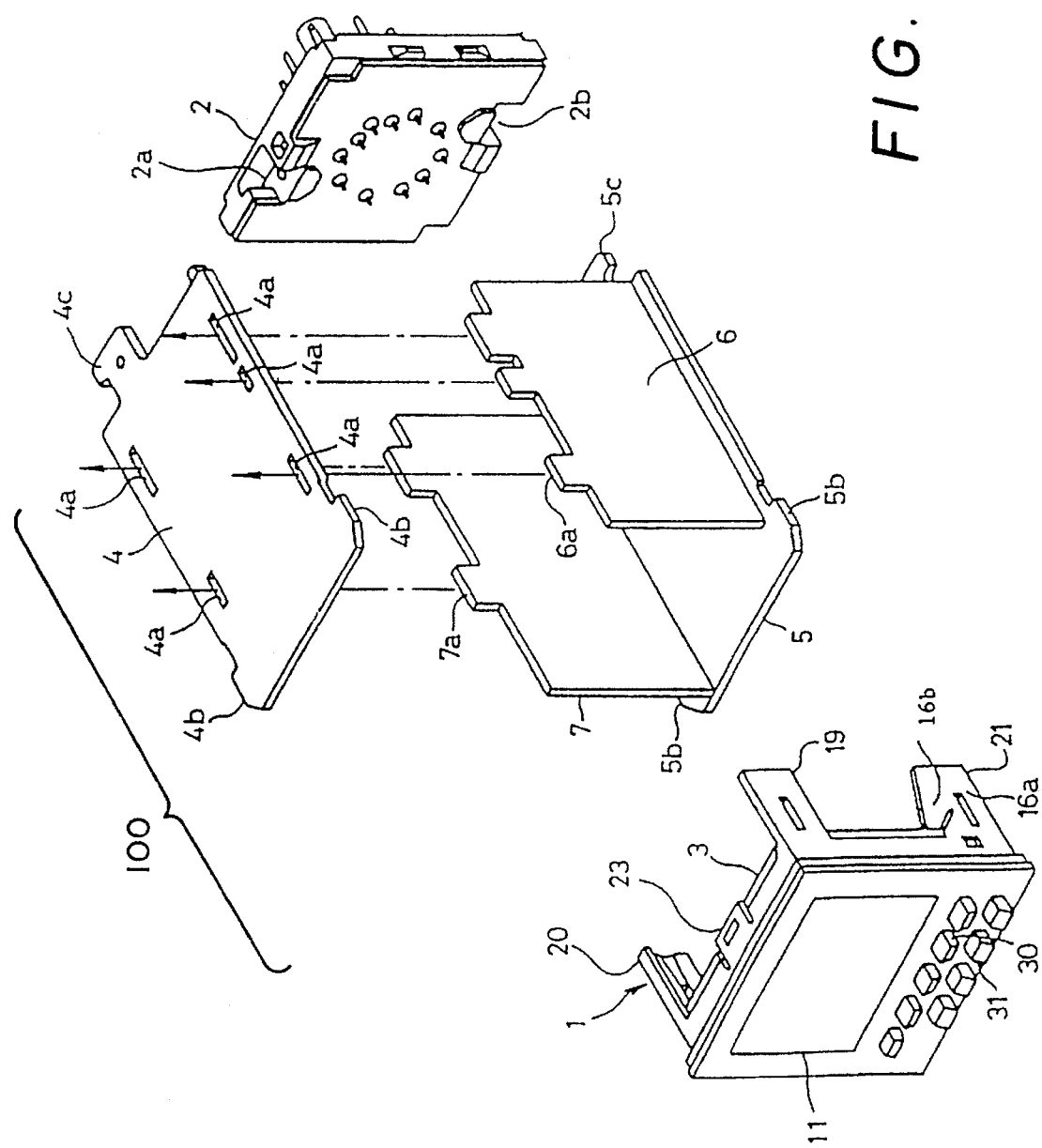
FIG. 1 is an exploded oblique view of a control device according to this invention.
Figure 2:
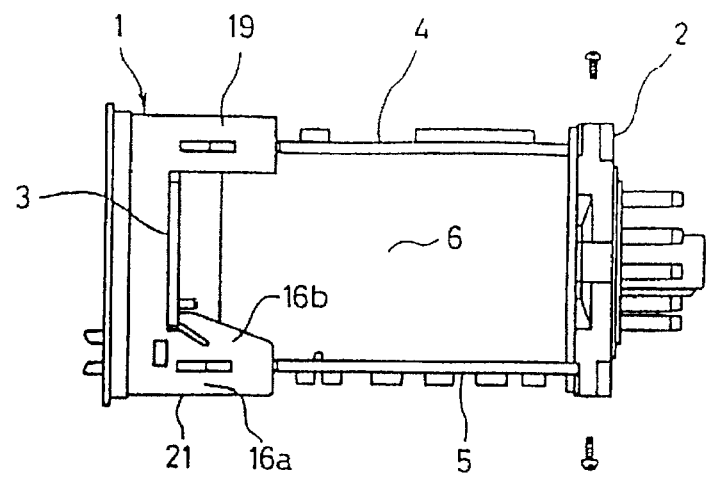
FIG. 2 is a lateral view of the same control device.

The counter includes a front assembly 1, a base 2, a front panel 3, upper and lower panels 4 and 5, and left and right panels 6 and 7 defining the printed circuit board assembly, as shown in FIGS. 1 and 2.

Figure 3:
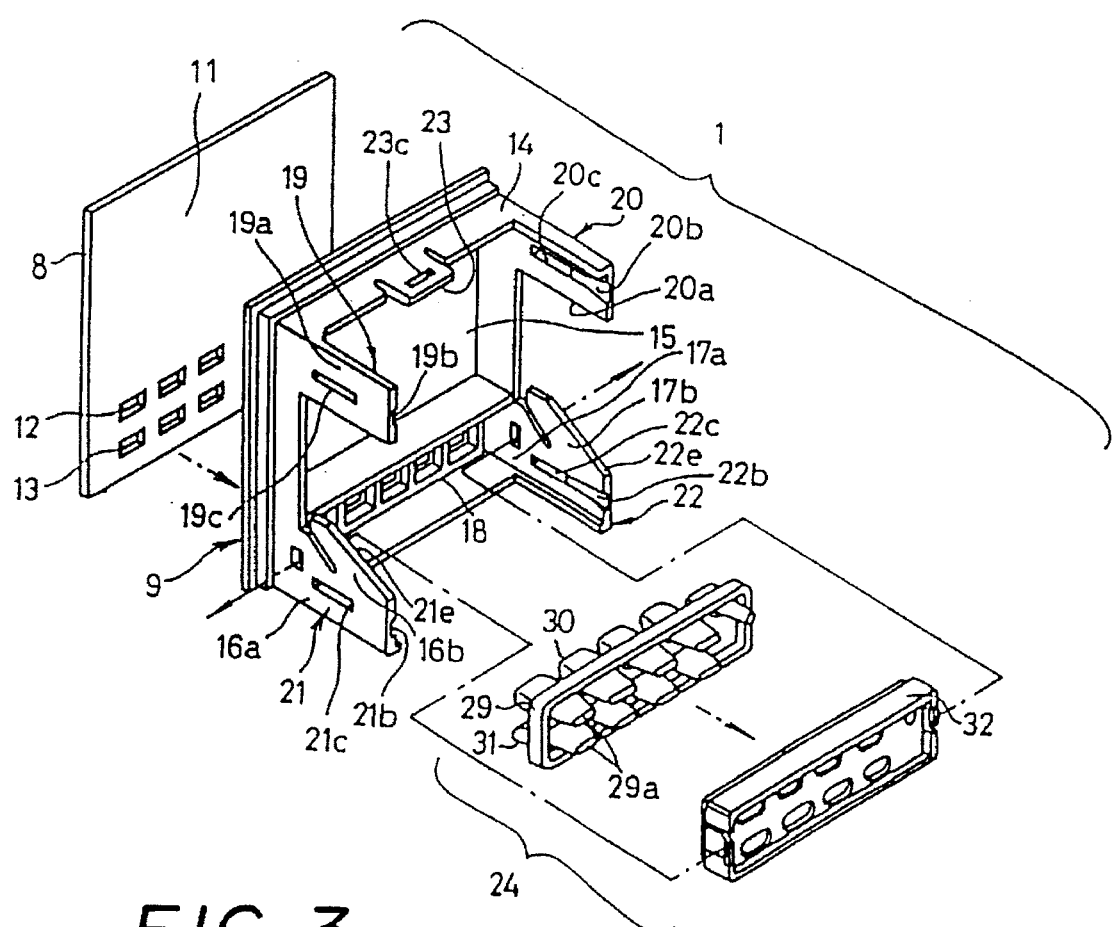
FIG. 3 is an exploded oblique view of the front casing of the same control device as viewed from the back.

The front assembly 1 includes a cover panel 8 and front casing 9, as shown in FIG. 3. The cover panel 8 includes a display 11 and a number of keyholes 12 and 13, which are arrayed in two horizontal rows just below display 11.

The front casing 9 includes a square casing 14, a space 15 for receiving the numeric display 10 (See FIG. 4), and a number of keyholes arrayed in two horizontal rows just below numeric space 15. On the back of the square casing 14 is a compartment 18 for receiving the switch mechanism to be installed.

From the four (4) corners of the square casing 14, four (4) hooks 19, 20, 21 and 22 extend rearwardly from the square casing 14. The two upper hooks 19 and 20 include rectangular catches 19a and 20a, each of which has in its center a slot 19c or 20c extending toward the rear of the case. Further, the upper hooks 19 and 20 are provided with grooves 19b and 20b extending from the rear ends of catches 19a and 20a to the slots 19c and 20c.

The lower hooks 21 and 22 consist of a first set of oblique catches 16a and 17a and a second set of catches 16b and 17b, which slant upward and toward the front of the case from the upper portions of catches 16a and 17a. The catches 16a, 17a, 16b, 17b are formed as a single piece.

In the center of each of catches 16a and 17a is a slot 21c or 22c, extending front to back. Grooves 21b and 22b extend from the rear ends of catches 16a and 17a to the slots 21c and 22c. The upper edges 21e and 22e of the oblique catches 16b and 17b may be tapered as shown.

In the center of the upper surface of the case 14 is hook 23, in the middle of which is slot 23c.

The cover panel 8 is mounted on the face of the casing 14, and keyswitch assembly 24 is mounted into the compartment 18 designed to receive it. In this way the front assembly 1 is completed.

The keyswitch assembly 24 comprises a rubber frame 29, two (2) rows of up and down-counting keys 30 and 31, and switch guard 32. The rubber frame 29 is inserted into the compartment 18, and the switch guard 32 locks the frame into the compartment. The tops of upper and lower keys 30 and 31 protrude through the keyholes in the casing 14 and through the two rows of keyholes 12 and 13 in the cover panel 8.

Figure 9:
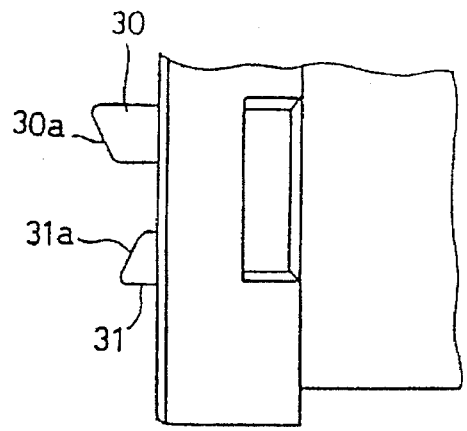
FIG. 9 is a lateral view of the front of a control device designed according to this invention.

As can be seen in FIG. 9, the tops of the keys 30 in the upper row (30a) are beveled downwardly while those in the lower row 31a are beveled upwardly.

Figure 4:
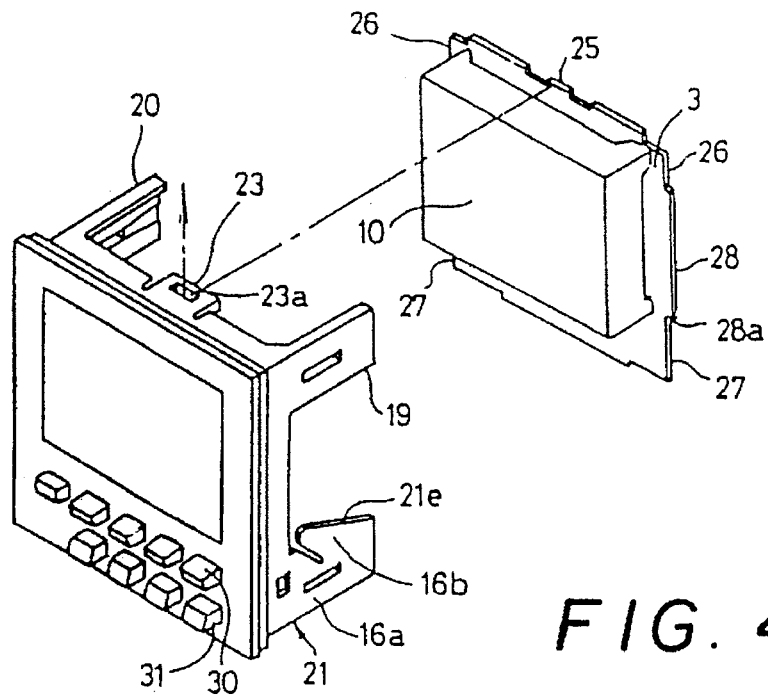
FIG. 4 is an exploded oblique view of the front casing of the same control device as viewed from the front.

As can be seen in FIG. 4, a tab 25 is provided in the center of the upper edge of the front panel 3. Rectangular portions of the upper and lower corners of front panel 3 are cut away at 26 and 27, and the remaining center portion of the left and right edges constitutes tabs 28. The LCD 10 is mounted on the mounting surface of front panel 3. A number of switch patterns (not pictured) are provided below the LCD 10.

A number of slots 4a are provided on the upper and lower panels 4 and 5, as shown in FIG. 1, and tabs 4b and 5b are provided on the front corners of panels 4 and 5. The left and right panels 6 and 7 both have a number of tabs 6a and 7a on their upper and lower edges.

Figure 5:
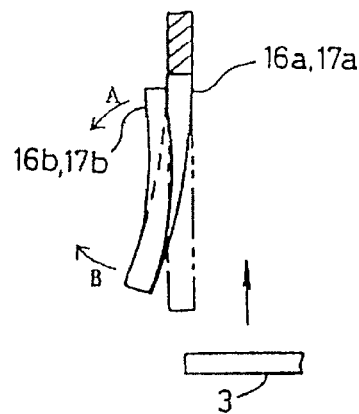
FIG. 5 illustrates the deformation of the hooks in the front casing of the same control device.

The first step in assembling this device is to mount front panel 3 in the front assembly 1. This is done by inserting left and right hooks 19 and 20 on the upper portion of front assembly 1 into cutaway portions 26 on the upper corners of the front panel 3, and at the same time inserting the ends of left and right hooks 21 and 22, on the lower portion of the assembly, into cutaway portions 27 on the lower corners of the front panel 3. When the front panel 3 is connected (see FIG. 5), the first set of catches 16b and 17b on lower hooks 21 and 22 are bent outwardly in direction A by the front panel 3.

When the front display assembly 1 is pushed onto front panel 3, the beveled edges 21e and 22e of catches 16b and 17b on lower hooks 21 and 22 press against the lower edges 28a of tabs of the front panel 3, bordered above and below by cutaway portions 26 and 27. When beveled edges 21e and 22e on the hooks run up against edges 28a on the front panel 3, the second set of catches 16b and 17b are bent outwardly by the tabs 28 of the front panel 3 in a direction A shown in FIG. 5.

Figure 6:
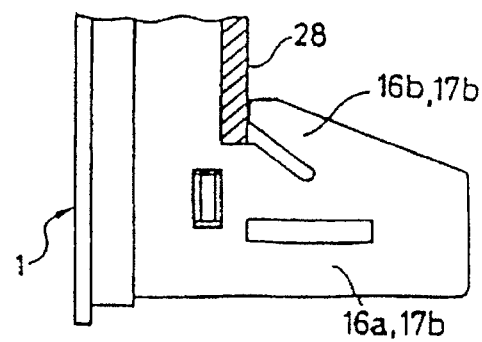
FIG. 6 illustrates how the hooks engage with the front panel in the front casing of the same control device.

When front display assembly 1 is completely pushed onto front panel 3, catches 16b and 17b lock against the tabs 28 as shown in FIG. 6, and tab 25 on front panel 3 engages in slot 23a on the hook 23. In this way, the front panel 3 is securely mounted onto front panel 3. The LCD 10 is inserted against the back of numeric display 11 on case 14. The printed contacts 29a on the rear ends of upper and lower keys 30 and 31 in the keyswitch assembly 24 come in contact with the switch pattern (not shown) on the front surface of front panel 3.

When the front panel 3 has been installed in front display assembly 1, a wide space is available on the sides of front panel 3 between the upper hooks 19 and 20, and catches 16b and 17b on lower hooks 21 and 22.

As shown in FIG. 1, tabs 6a and 7a on the left and right panels 6 and 7 engage in slots 4a on upper and lower panels 4 and 5. Projections 4c and 5c on the rear edges of panels 4 and 5 engage in grooves 2a and 2b on the top and bottom of base 2. In this way upper and lower panels 4 and 5 and side panels 6 and 7 are mounted securely to base 2, and the panel assembly is completed except for the front panel.

As shown in FIGS. 1 to 3, tabs 4b on the front corners of upper panel 4 slip into grooves 19b and 20b on upper hooks 19 and 20, and tabs 5b on the front corners of lower panel 5 slip into grooves 21b and 22b on lower hooks 21 and 22.

Figure 7:
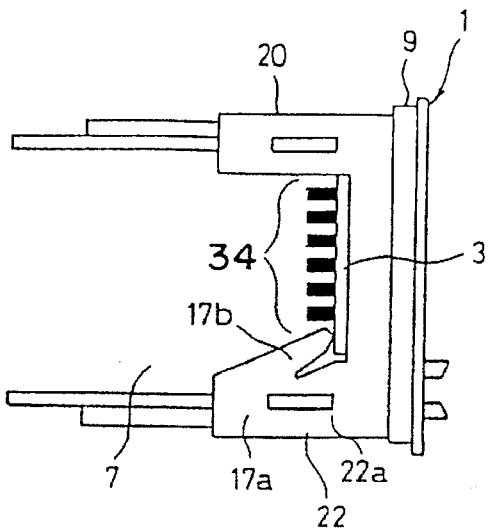
FIG. 7 illustrates solder bridges which have been formed on the connecting surface of the front panel of the same control device.

When the front panel 3 is pressed into the completed front display assembly 1, tabs 4b and 5b on upper and lower panels 4 and 5 engage in slots 19c, 20c, 21c and 22c on hooks 19, 20, 21 and 22. As shown in FIG. 7, the wiring patterns on upper and lower panels 4 and 5 and those on left and right panels 6 and 7 are connected to the patterns on the front panel 3 by means of solder bridges 34. In this way, front panel 3 is securely fixed to the front edges of upper and lower panels 4 and 5 and side panels 6 and 7.

A rear casing (not pictured) is mounted to the front display assembly 1 and the counter is then completely assembled.

Figure 8:
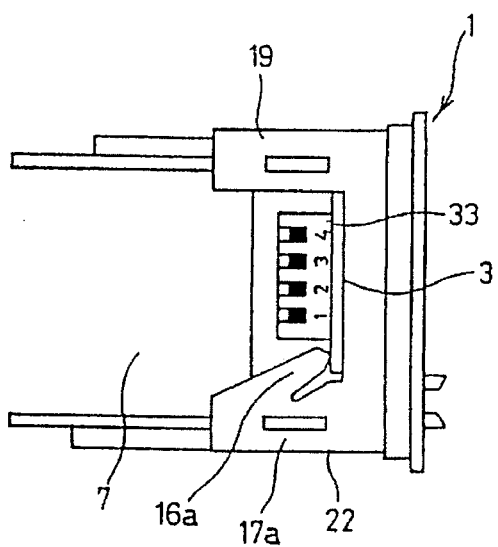
FIG. 8 (1) illustrates how dipswitches can be installed on the connecting surface of the front panel of the same control device.
Figure 8:
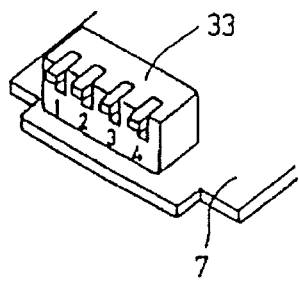

In the embodiment discussed above, when front panel 3 has been mounted onto front display assembly 1, a wide space is available on the sides of front panel 3 between the upper hooks 19 and 20, and catches 16b and 17b on lower hooks 21 and 22. This space makes it possible to create a number of the aforementioned solder bridges 34 as shown in FIG. 7, or dipswitches 33 can be installed on side panels 6 and 7 in place of solder bridges 32 as shown in FIGS. 8(1) and (2).

There are two horizontal rows of up and down-counting key switches 30 and 31, just below display 11. The keys 30 in the top row are higher than the keys 31 in the lower row to prevent the inadvertent actuation of more than one key with a fingertip of the user.

Figure 10:
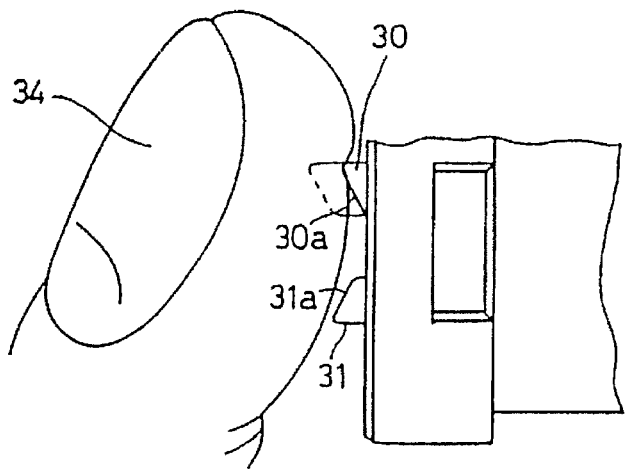
FIG. 10 illustrates how the keys in the upper row of the same control device are depressed by a finger.
Figure 11:
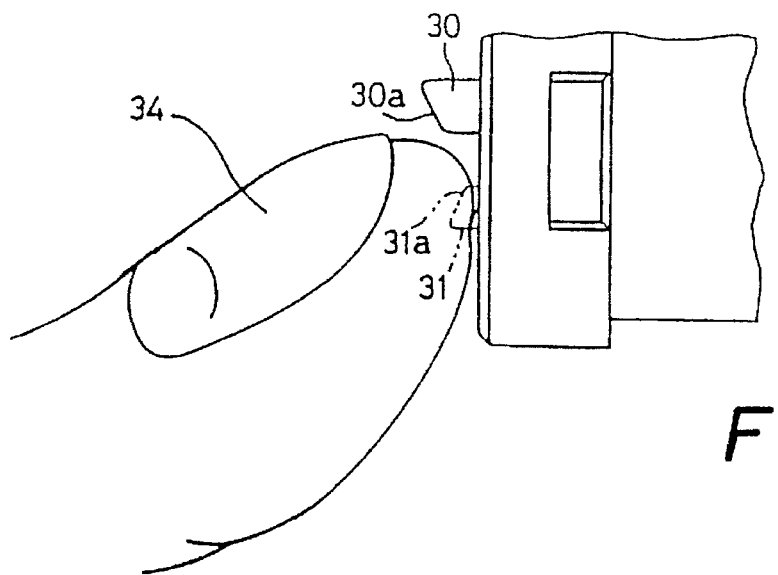
FIG. 11 illustrates how the keys in the lower row of the same control device are depressed by a finger.

In addition to the keys 30 and 31 being different in height, as can be seen in FIGS. 10 and 11, the tops of the keys in each row 30a and 31a are beveled. This prevents the possibility of the operator's finger 34 accidentally striking a key in the opposite row when he is operating the up or down-counting keys in either row 30 or 31, despite the limited space available for the keys. Because upper and lower rows 30 and 31 are adjacent to each other, they operate with a feel very much like that of seesaw ("rocker") action type keys when the operator's finger moves easily from one row to the other.

Because the two rows of keys 30 and 31 are located below numeric display 15, as discussed above, the values are never hidden by the user's finger 34 when the user is operating the keys 30 and 31.

When keys 30 and 31 of key assembly 24 are pushed, a short circuit is made to the switch pattern on front panel 3 by printed contacts 29a on the back of rubber frame 29. This system constitutes a switch which has fewer parts and is simpler to assemble than a rotary switch, so it allows the switch assembly to be constructed at a lower cost.

As shown in FIGS. 1–4, this device according to the present invention has at least one hook 19, 20, 21, 22 or 23 which engages with at least one projection 25, 28 on the front panel 3 of the printed circuit board assembly 100. The front display assembly 1 is a separate component from the front panel 3.

In the embodiment shown in FIGS. 1–6, four (4) hooks are located at the four (4) corners of the display assembly 1. In addition, a hook 23 is provided at the top of the front display assembly 1 while the bottom is not provided with such a hook allowing soldering bridges to be positioned anywhere along the bottom between the hooks 21 and 22 located at the corners. To compensate for the lack of a hook at the bottom of the display assembly 1, the lower set of hooks 21 and 22 are provided with an additional set of catches 16b and 17b to ensure adequate connection at a lower portion of the assembled control device.

The hooks 21 and 22 project rearwardly from two (2) corners of the front casing 9 with slots 21c and 22c provided therein into which the tabs 5b of the lower panel 5 of the printed circuit board assembly 100 engage. On the upper portions of these hooks, projecting toward the front casing 9 are catches 16b and 17b which hold the front panel 3 against the front casing 9. With this design, a wide space is available along the sides of the front panel when the front display assembly 1 has been mounted onto the front panel of the printed circuit board assembly 100.

This space makes it possible to create a number of solder bridges, or alternatively, dipswitches can be mounted in the space instead of solder bridges. With respect to the molding process, this design obviates the necessity for holes in the numeric display 11, which are unsightly and make it difficult to insure that the cover panel is watertight.

In the embodiment described above and shown in FIGS. 4 to 6, a portion is cut out of each corner of the front panel 3. The edges of these cut-out portions 26 and 27 engage with the hooks 19, 20, 21 and 22 when the tips of the hooks are pushed onto the cut-out portions on the front panel 3, the edges of the catches 16a, 17a, 19a and 20a on the hooks 19, 20, 21 and 22 come up against the edges of the tabs 25 and 28, and the hooks 19, 20, 21 and 22 are bent outwardly by the tabs 4b and 5b of the upper panel 4 and lower panel 5. The catches 16b and 17b on the front assembly 1 then engage with the tabs 28 on the front panel 3. Thus, the front panel can be mounted securely to the front display assembly 1 merely by pushing it until the ends of the hooks slip into the openings in the panel.

This embodiment is distinguished by the fact that there are two horizontal rows of up and down-counting key switches 30 and 31 just below the display 11 on the cover panel 8. The top of the keys in both rows are beveled so that the keys in each row incline toward those in the other row. The keys in the upper row 30 protrude further than those in the lower row 31. Since the keys are located below the display 11, the values are never hidden by the operator's finger when he is operating the keyswitches.

Because the tops of the keys are beveled, the operator is prevented from accidentally striking a key in the opposite row when he is operating the up or down-counting keys in either row, despite the limited space available for the keys. The upper and lower rows are adjacent to each other so that when the operator's finger moves easily from one row to the other, the keys have a seesaw type action.

A second embodiment of the present invention will now be described in detail.

Figure 12:
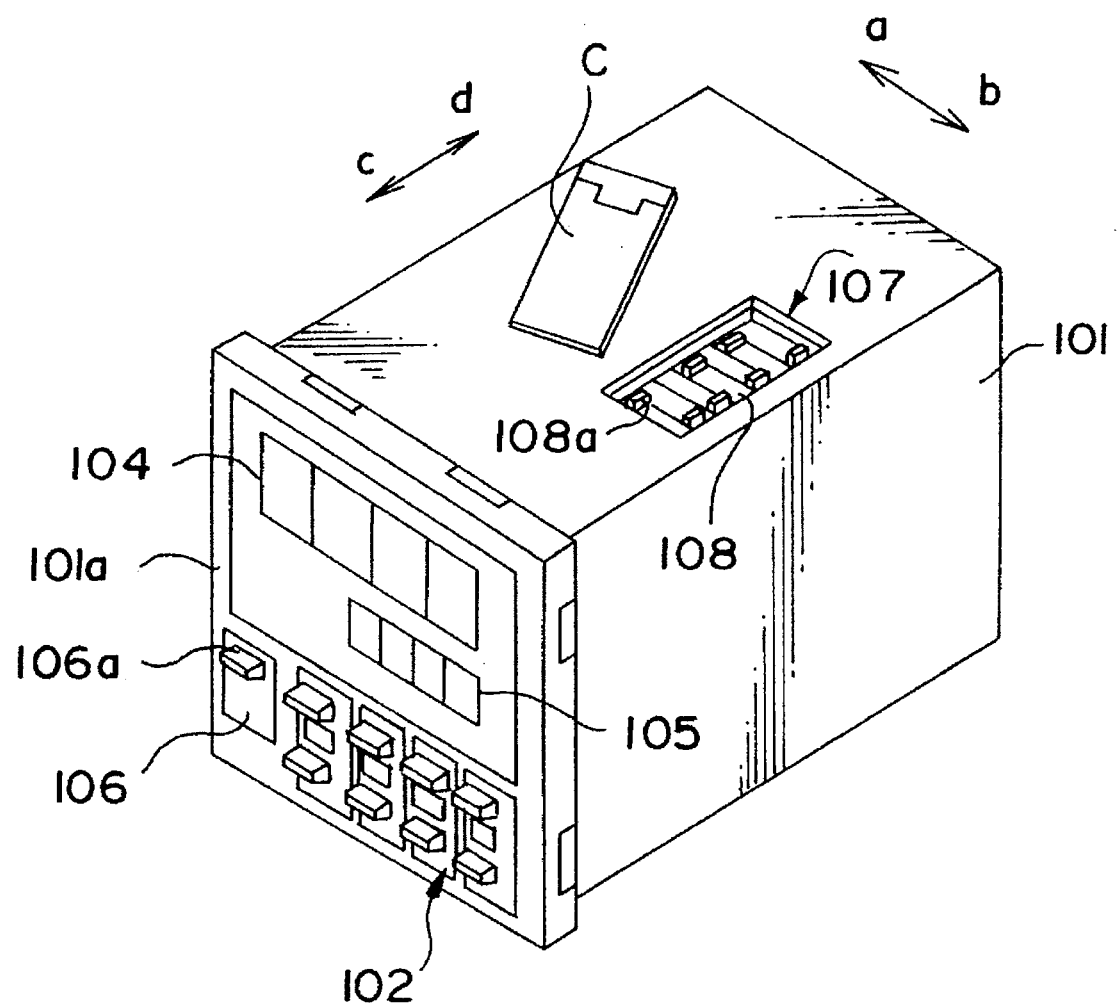
FIG. 12 is an oblique external view of a counter which is a preferred embodiment of the control device of this invention.
Figure 13:
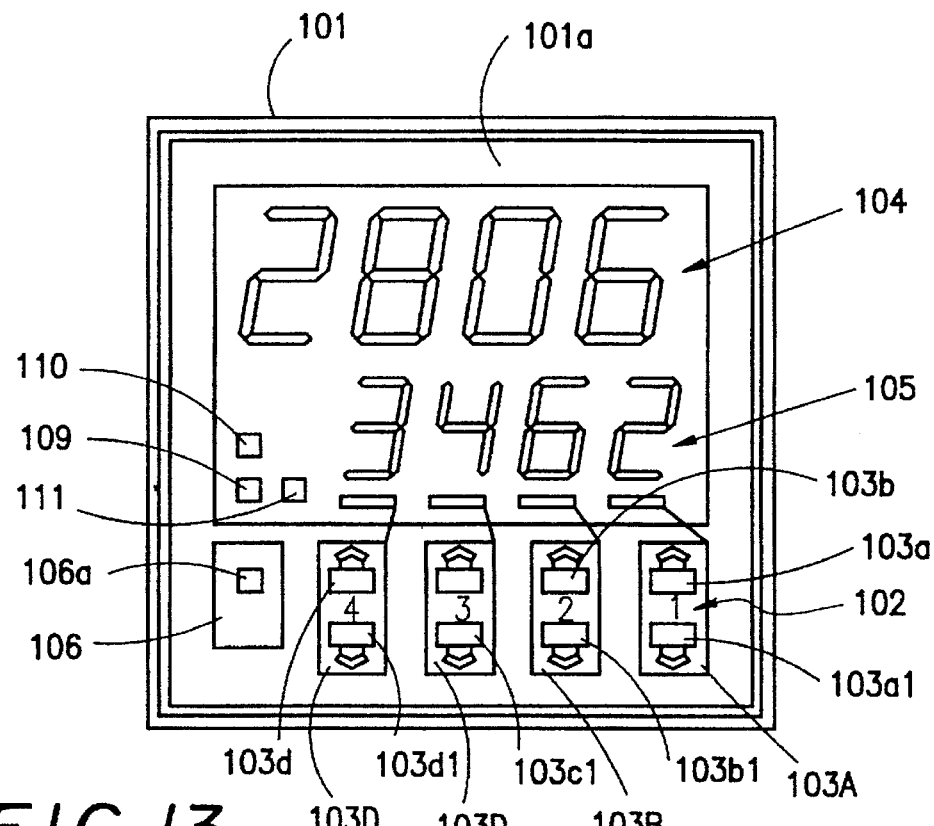
FIG. 13 is a frontal view of the same counter illustrating the normal counter operating mode.

The counter includes a front assembly 101, a base 102, a front panel 103, upper and lower panels 104 and 105, and left and right panels 106 and 107 defining the printed circuit board assembly, as shown in FIGS. 12 and 13.

The counter 101 includes a key panel 102 for setting numerical values provided on the front 101a of case 101. The keys 103A through 103D, as shown in FIG. 13, correspond to the four places in the numerical values to be set.

Display 104 is the current value (current numerical value) display on the front of the case 101a. It can, for example, be made of seven-segment LEDs. Below the current value numeric display 104 on the front 101a of case 101 is a four-place set value numeric display 105, which may also be made from seven-segment LEDs.

On the face 101a is reset switch 106 with reset key 106a. Built into the interior of the case 101 and protected by cover C is mode switch assembly 107. This assembly may consist, for example, of eight dipswitches 108. When the key 108a of each dipswitch 108 is moved in direction a shown by the arrow, the input is switched on; when it is moved in direction b, the input is switched off.

FIG. 13 is a frontal view of the face 101a of the case 101. The current value numeric display 104 shows "2806", while the set value display 105 shows "3462". The keyswitches 103A through 103D have up-counting keys 103a through 103d and down-counting keys 103a1 through 103d1. The four pairs of keys correspond to the four places in displays 104 and 105.

On the face 101a of the case 101 is reset display 109, which lights up to display the state of the reset input entered via reset switch 106. When reset key 106a is operated, contact is made or broken in switch 106. The state of this input is shown when reset display 109 lights up.

The output display 110, adjacent to reset display 109 on face 101a of the case 101, lights up to display the output state of the output circuit. If key protectors are installed on the switches 103A through 103D to prevent the values which have been set from being changed, a key protection display 111 is provided. This display lights up to show the input state of the key protectors.

Figure 15:
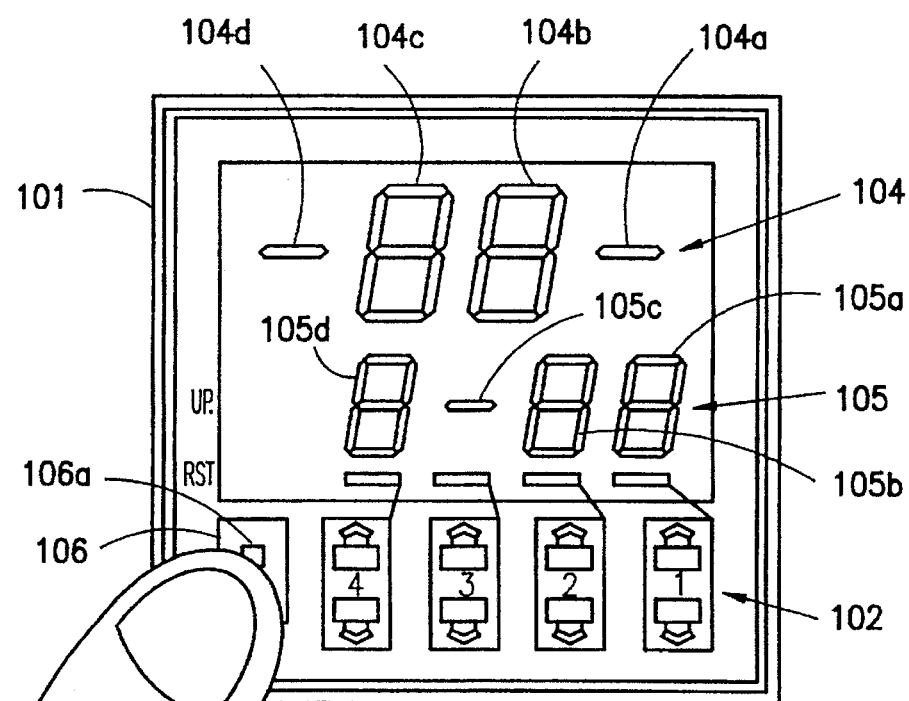
FIG. 15 is a frontal view of the same counter illustrating the dipswitch display mode.

FIG. 15 is a block diagram showing the essential components of a counter designed as discussed above. The keyswitch circuit 112 is connected to the switches 103A through 103D and to reset switch 106. The mode switching circuit 113 switches the mode, and contains the dipswitches 108. With the help of microprocessor 114, the control circuit for input and output, mode switching circuit 113 switches the input mode of circuit 115, the circuit for input of numerical values, and the output mode of output circuit 116, which controls other devices and maximum counting speed and the one-shot output time.

The system reset circuit is indicated as 117. When the reset is pushed after the power from power supply circuit 118 has been applied, the system will return to ordinary counter operating mode, as shown in FIG. 13. If, on the other hand, reset key 106a is pushed before the power from circuit 118 is applied, reset switch 106 will enter the ON state. When power is applied to circuit 118, the ON or OFF state of each dipswitch 108 in mode switch assembly 107 will be displayed via current value display 104 and the set value display 105 as either a character 8 or a dash, as shown in FIG. 14.

A character 8 indicates that the input of the corresponding dipswitch 108 is on; a dash indicates that it is off. If the dipswitch 108 consist of eight switches arrayed in direction c–d indicated by an arrow, then the on-off state of switches #1 through #4 can be shown on segments #4a through #4d of current value numeric display 104, and the on-off state of switches #5 through #8 can be shown on segments #5a through #5d of set value display 105.

Figure 14:
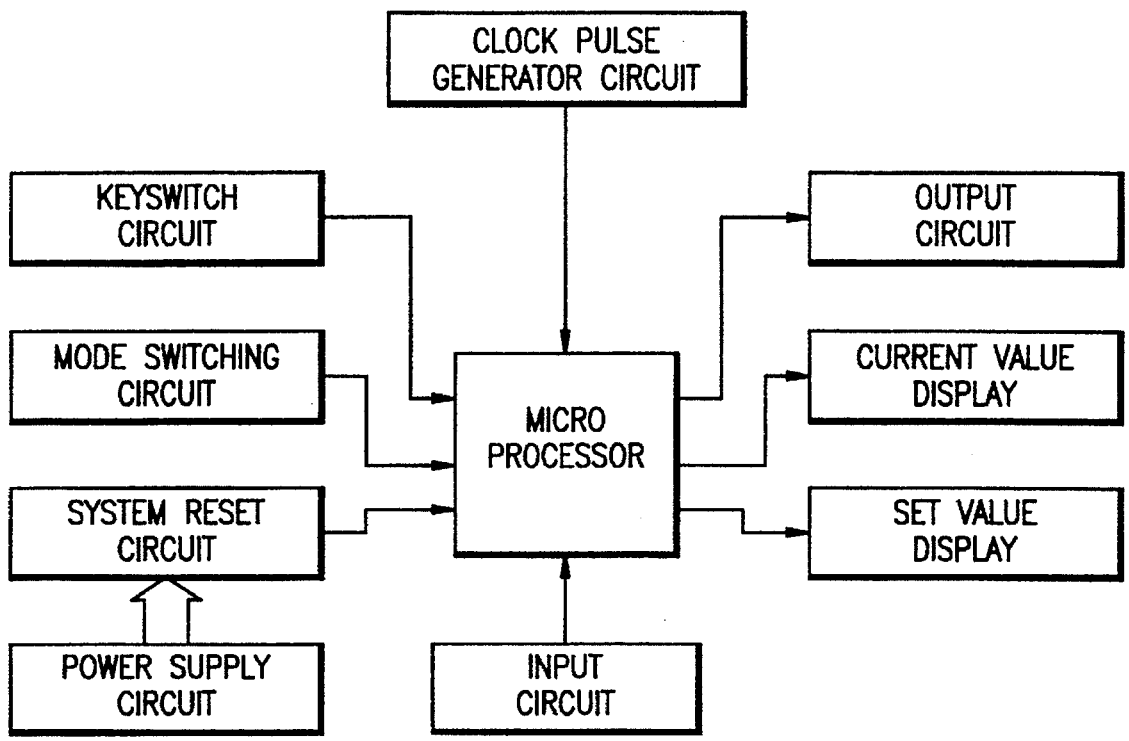
FIG. 14 is a block diagram showing the configuration of the essential components of the same counter.

The counter shown in FIG. 14 is set to dipswitch display mode. From this display, the operator can verify that switches #2, #3, #5, #6 and #8 are on, while switches 1, 4 and 7 are off.

The microprocessor 14 controls the input and output by synchronizing them with clock pulses generated by circuit 119.

Figure 16:
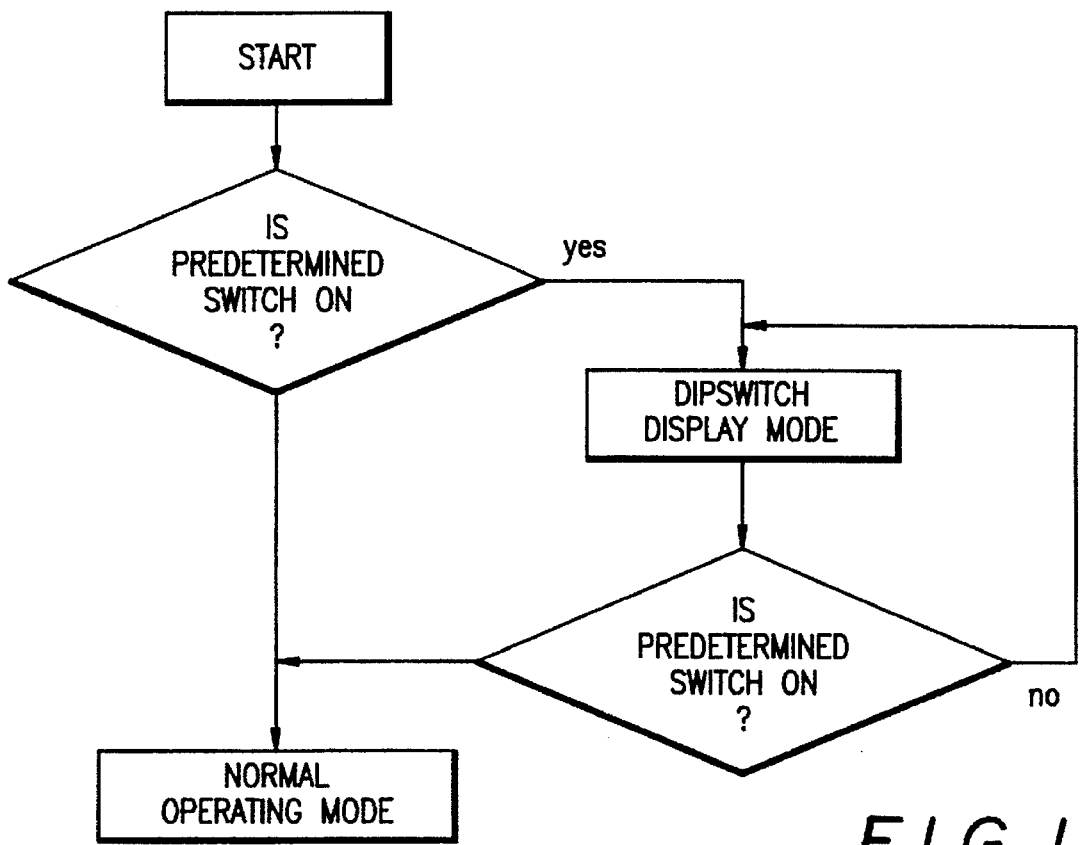
FIG. 16 is a flowchart illustrating the procedure followed by the same counter when switching between modes.

The procedure followed in a counter configured as described above when switching between normal counter operating mode and dipswitch display mode, with reference to the flowchart in FIG. 16 will now be described.

If the operator uses switches 103A through 103D to set, for example, the value "3462", this value will be stored in microprocessor 114 when power is applied to circuit 118, and it will appear on set value display 105, as shown in FIG. 13.

The on-off state of reset switch 106 and the on-off states of the eight dipswitches 108 in mode switch assembly 107 are also stored in the microprocessor 114. The microprocessor 114 distinguishes whether or not there is pressure on reset key 106a, that is, whether switch 106 is on or off (Step 20: Judgment). If the key 106a is not depressed, counting will proceed in normal counter operating mode; the number "2806" will appear on current value display 104; and the number "3462" will appear on set value display 105 (Step 21: Processing). When the aforesaid numerical value reaches the set value, 3462, circuit 116 will output an ON signal.

If reset key 106a is held down so that reset switch 106 is on when power is applied to the circuit 118, the judgment will be made in Step 20 that key 106a has been pressed, and the on-off states of dipswitches #1 through #8 will be displayed on segments 104a through 104d of current value display 104 and 105a through 105d of set value display 105, as shown in FIG. 14 (Step 22: Processing). An "8" will be displayed if the input of that dipswitch is on, and a dash will be displayed if it is off.

If the dipswitches 108 consist of eight switches arrayed in direction c-d indicated by an arrow in FIG. 12, then the on-off state of switches #1 through #4 will be shown on segments 104a through 104d of current value display 104, and the on-off state of switches #5 through #8 will be shown on segments 105a through 105d of set value display 105.

The counter shown in FIG. 14 is set to dipswitch display mode. From this display, the operator can verify that switches #2, #3, #5, #6 and #8 are on, while switches #1, #4 and #7 are off. The entire process of verification is extremely simple.

A further embodiment will now be described in detail.

In this embodiment, the control device is a timer. Since the external appearance of this timer is virtually identical to that shown in FIG. 12 and its essential components are virtually identical to those shown in FIG. 15, further diagrams and discussion of these common aspects have been omitted.

The timer of this embodiment does have aspects in which it differs from the preceding embodiment. The primary values appearing on current value display 104 and set value display 105 will be current time and set time. Mode switching circuit 113 in FIG. 15 switches the mode of circuit 115, which is used to input numerical values; the mode of circuit 116, which controls other devices; maximum counting speed; and input filter time. The auxiliary value which can be set or changed is the one-shot output time, which will be discussed below.

Figure 17:
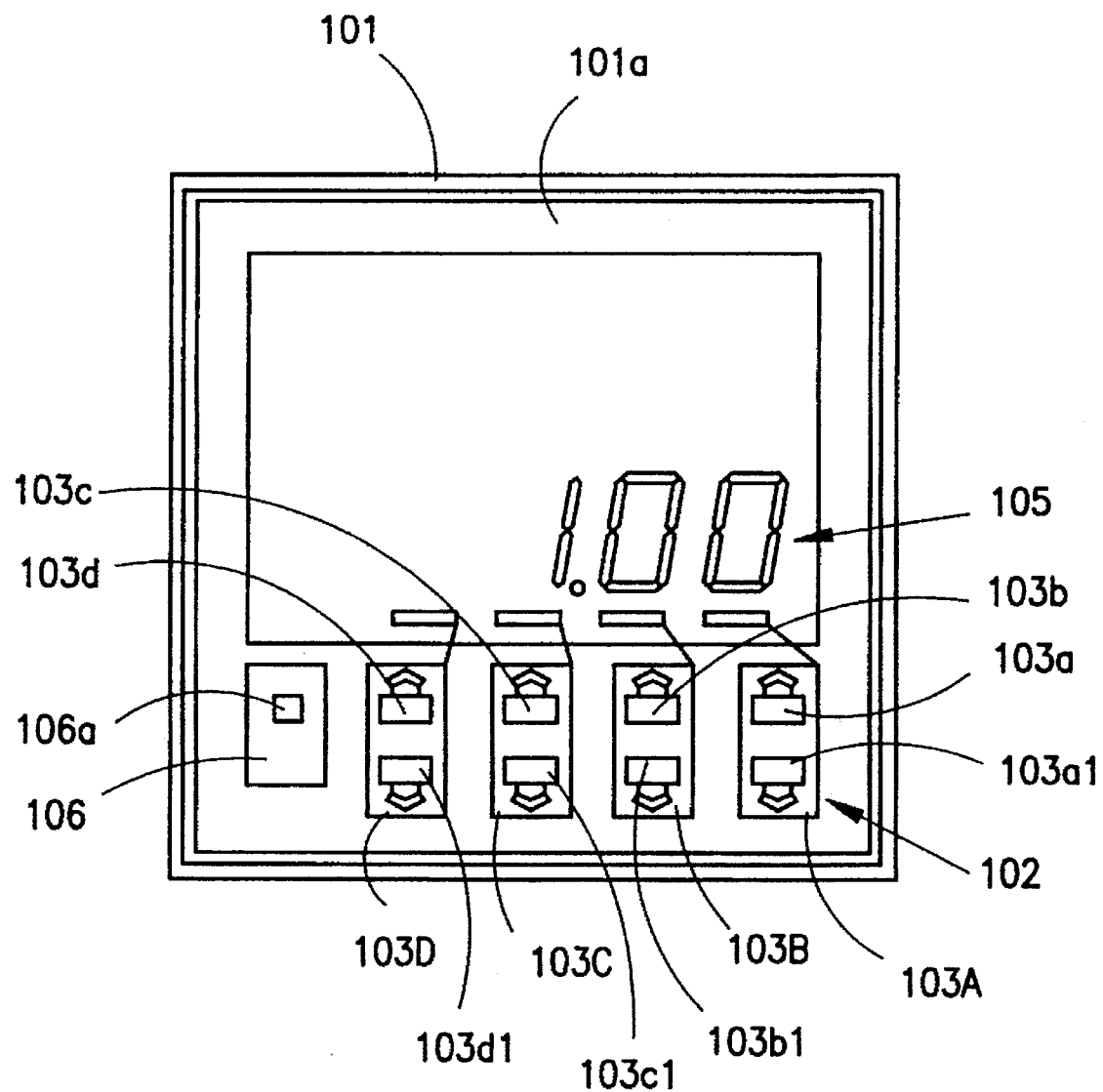
FIG. 17 is a frontal view of a timer which is another preferred embodiment of the control device of this invention, illustrating the mode for setting the one-shot output time.

Assume that before power was applied, a predetermined up and down-counting keys 103a through 103d and 103a1 through 103d1 were pressed to turn on certain of the four switches 103A through 103D, which constitute the main input switches. In this case, switches 103A and 103B were turned on when the operator pressed down-counting keys 103a1 and 103b1 before power was applied to circuit 118. When power is applied to circuit 118, the device shifts into the mode for setting the one-shot output time. The value for the one-shot output time which is currently set, in this case "1.00 sec", will appear in set value display 105 as shown in FIG. 17.

When the timer is in the mode for setting the one-shot output time, as discussed above, current value display 104 will be off so that the operator can distinguish clearly by eye the display used for this mode from that used for normal mode or other modes.

In the mode for setting the one-shot output time, just as in normal mode, the user selects a value by manipulating as the user chooses the up keys 103a through 103d and the down keys 103a1 through 103d1 to set the four switches 103A through 103D. The value for the one-shot output time which the user has set appears on the set value display 105 in real time. The one-shot output time can be set anywhere in the range between 0.01 sec. and 99.99 sec. If the value is set to 0.00 sec., the output will be held, and will normally remain on from the time of output until it is reset.

Like values set in normal mode, the one-shot output time which has been set or changed will be written into and stored in the system memory (e.g. an EEPROM, not pictured) when the power supply is cut off. When the timer is in the mode for setting the one-shot output time, the control output is off; timing cannot be performed; START and RESET commands cannot be input; and the reset key cannot be operated.

Figure 18:
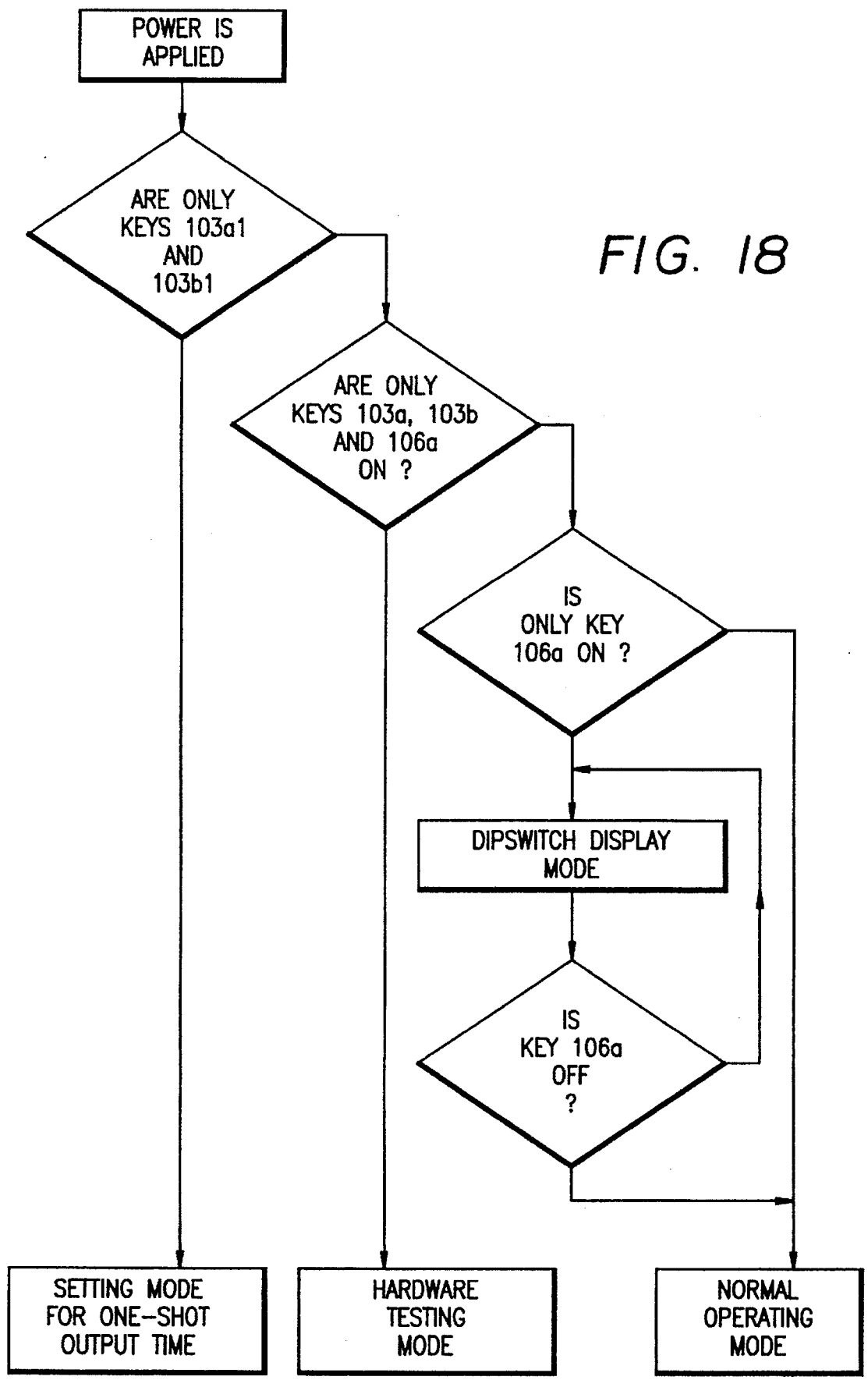
FIG. 18 is a flowchart illustrating the procedure followed by the same timer when switching between modes.
Figure 19:
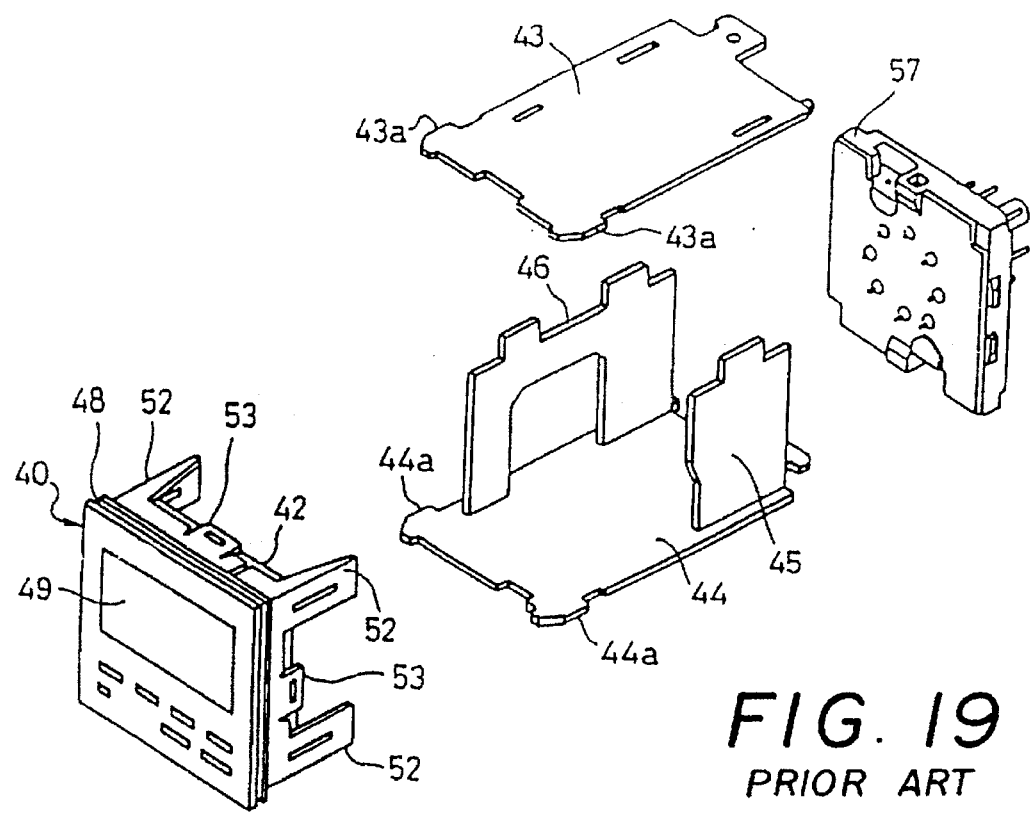
FIG. 19 is an exploded oblique view of an existing control device.
Figure 20:
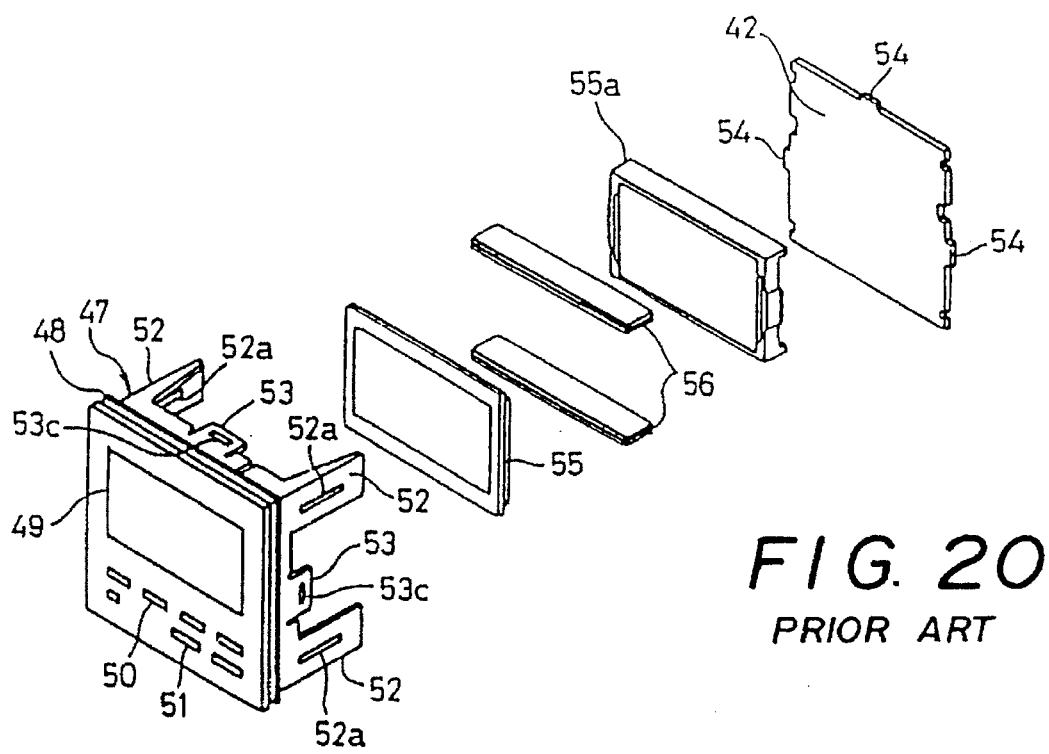
FIG. 20 is an exploded oblique view of the front casing of an existing control device as seen from the front.
Figure 21:
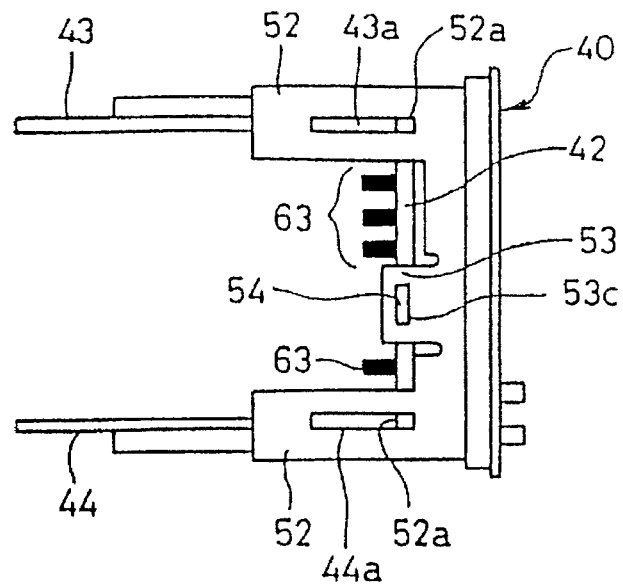
FIG. 21 illustrates the solder bridges provided on the connecting surface of the front panel of the same control device.
Figure 22:
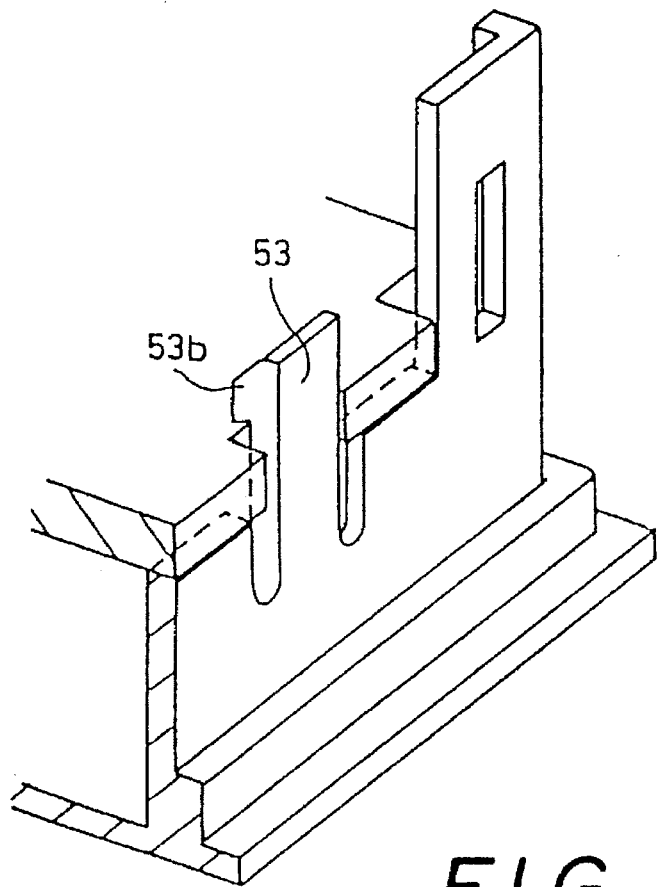
FIG. 22 is an oblique view showing the hook on the front casing of an existing control device.
Figure 23:
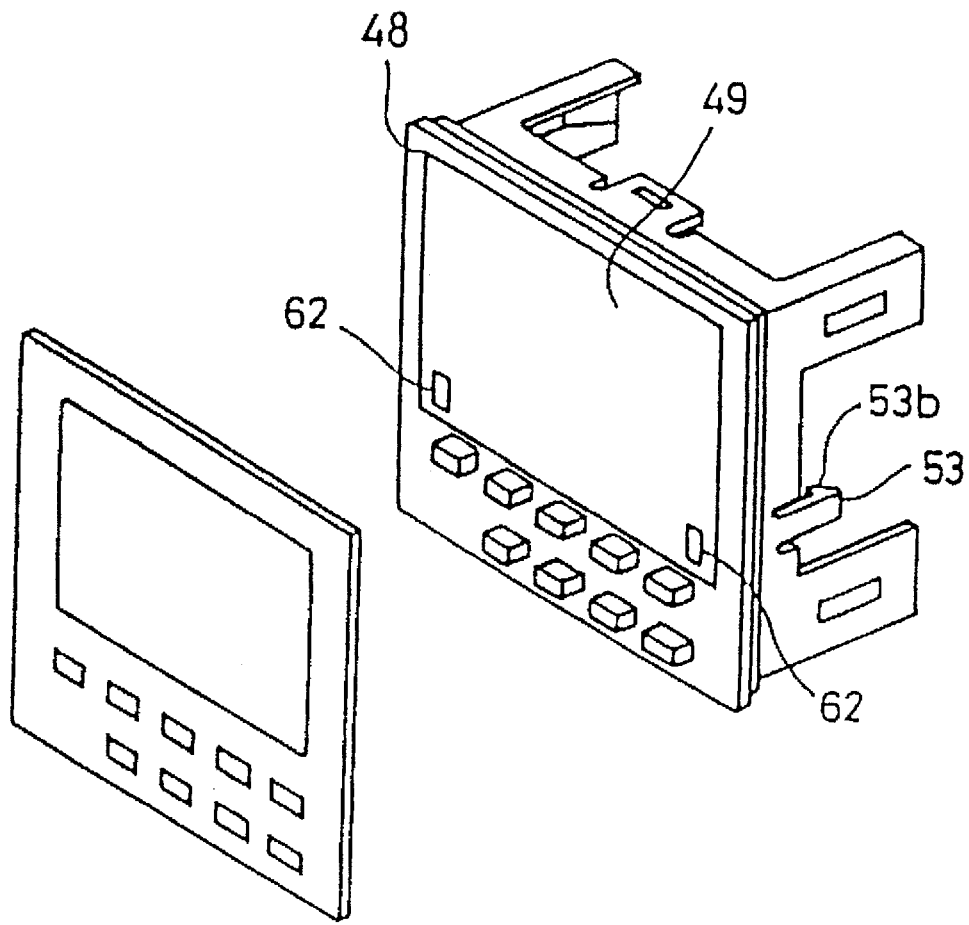
FIG. 23 is an exploded oblique view of the front casing of the same control device.
Figure 24:
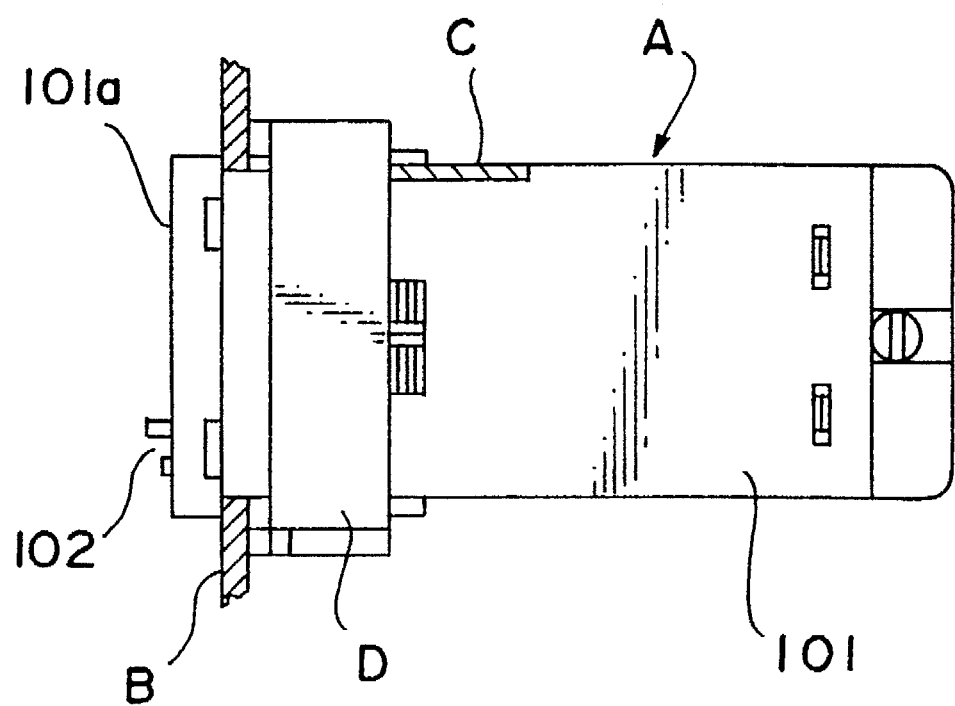
FIG. 24 is an overhead view of an existing counter showing how it is mounted to its control panel.

The procedure followed in a timer configured as described above when switching between normal operating mode and setting mode for one-shot output time, with reference to the flowchart in FIG. 18 will now be described.

When the operator sets a value, say "1200", by operating switches 103A through 103D, this value will be stored in the system memory of microprocessor 114 and will appear on set value display 105 when power is applied to circuit 118.

The on-off state of reset switch 106 and the on-off states of the eight dipswitches 108 in mode switch assembly 107 are also stored in the microprocessor 114.

The microprocessor 114 distinguishes whether or not there is pressure on keys 106a, 103a through 103d and 103a1 through 103d1 (Steps 30–32: Judgments). If keys 106a, 103a, 103b, 103a1 and 103b1 are not depressed, the timer will be in normal operating mode, timing will be performed, and the current value and the set time will appear on current value display 104 and set value display 105 (Step 33: Processing). In normal operating mode, when the timing value and the set time coincide, circuit 116 will output an ON signal.

If any of the keys 106a, 103a, 103b, 103a1 and 103b1 have been pressed, which combination of keys has been pressed will be determined in the Steps 30 to 32 when power is applied to circuit 118. If only down keys 103a1 and 103b1 are on, the timer will shift into the mode for setting the one-shot output time. If only reset key 106a and up keys 103a and 103b are on, the timer will shift into the hardware testing mode. If only reset key 106a is on, it will shift into the dipswitch display mode (Steps 34–36: Processing). Dipswitch display mode remains in effect only as long as reset key 106a is depressed. When key 106a is released, this mode goes off, and the timer reverts to normal operating mode (Step 37: Judgment). For all other modes, the mode will be selected based on the judgment made at the time power is applied, and the timer will remain in the selected mode as long as power continues to be applied to circuit 118.

When the timer has shifted into the mode for setting the one-shot output time, as discussed above, values are set just as in normal setting mode. The operator selects a value by manipulating as he chooses the up keys 103*a* through 103*d* and the down keys 103*a*1 through 103*d*1 to set the four aforementioned rotary switches 103A through 103D. The value for the one-shot output time which he has set appears on the aforesaid set value display 105 in real time. When the power supply is cut off, the one-shot output time which has been changed as described above will be stored in the system memory.

In the preferred embodiments discussed above, this invention was applied to a counter and a timer. It would, of course, also be possible for a control device designed according to this invention to be a thermoregulator or other control device.

As discussed above, the control device described above shows on the aforesaid display the on-off state of each dipswitch when the appropriate switch is held down while power is being applied. This display stays on as long as the switch is depressed. This enables the operator to easily verify the state of the dipswitches by viewing the front of the case regardless of whether the case is mounted on the control panel. Thus, it significantly reduces the labor required to verify the state of the switches.

The control device according to the present invention is distinguished by the fact that when a predetermined key, which is one of the operating keys of the main input switch assembly, is held down while the power supply is being connected, the device shifts into auxiliary setting mode and the current auxiliary values are displayed on the main numeric display. The auxiliary values can be set or changed easily, and no special switches are needed. There is no mode key, so the user cannot accidentally change the values, nor can they be changed as a joke or prank. Since one set of operating keys on the front of the case is used to set both the main and the auxiliary values, the size of the keytops can be increased to make it easier for the user to operate the switches. Using the operating keys to change the auxiliary values allows greater accuracy and precision than do dipswitches or a continuously variable switch.

What is claimed is:

1. A control device, comprising:

a printed circuit board assembly including a front panel connected to an upper panel, a lower panel and two side panels; and a display assembly connected to said printed circuit board assembly, said display assembly comprising a casing provided with a pair of top hooks and a pair of bottom hooks extending rearwardly therefrom, said top hooks each having a catch provided by a slot for interconnecting with a respective tab of said upper panel of said printed circuit board assembly, and said bottom hooks each having a pair of catches including a first catch provided by a slot for interconnecting with a respective tab of said lower panel of said printed circuit board assembly and a second catch provided by an oblique member having an edge extending forward from a rearward edge of said second catch, said edge terminating in a forward directed edge interconnecting with a back portion of a respective side tab of said front panel of said printed circuit board assembly.

2. A device according to claim 1, wherein said top hooks and said bottom hooks are located at corners of said casing of said display assembly.

3. A device according to claim 2, wherein said catches of said top hooks and said catches of said bottom hooks are located on sides of the casing of said display assembly.

4. A device according to claim 3, wherein said top hooks and said bottom hooks are cantilever mounted to said casing of said display assembly and configured to bend outwardly from sides of the control device when mounting said front panel onto said printed circuit board assembly.

5. A device according to claim 1, wherein said casing of said display assembly is provided with a hook having a catch defined by a slot interconnecting with a tab located on a top of said front panel.

6. A device according to claim 4, wherein rear edges of said casing of said display assembly contact front edges of said front panel of said printed circuit board assembly.

7. A device according to claim 1, wherein said top panel and said bottom panel of said printed circuit board assembly include edge portions cut out of each corner thereof defining said respective tabs of said top panel and said bottom panel that engage with said hooks when tips of said hooks are pushed onto said respective tabs of said top panel and said bottom panel, and portions of said catches on said hooks bend outwardly and snap back to fully engage with said respective tabs of said top panel and said bottom panel.

8. A device according to claim 1, including a top horizontal row of key switches positioned above a bottom horizontal row of key switches, said rows of key switches being located below a display panel of said display assembly, wherein contact surfaces of said keys switches in both rows are beveled, and further wherein contact surfaces of said upper horizontal row of key switches bevel downwardly and contact surfaces of said lower horizontal row of key switches bevel upwardly.

9. A device according to claim 8, wherein key switches in said upper horizontal row protrude further from a front surface of said display assembly than key switches in said lower horizontal row.

* * * * *